(12) United States Patent
Kamimura

(10) Patent No.: US 7,956,435 B2
(45) Date of Patent: Jun. 7, 2011

(54) SEMICONDUCTOR DEVICE

(75) Inventor: Tomohiro Kamimura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 186 days.

(21) Appl. No.: 12/370,171

(22) Filed: Feb. 12, 2009

(65) Prior Publication Data

US 2009/0230539 A1   Sep. 17, 2009

(30) Foreign Application Priority Data

Mar. 12, 2008   (JP) ................................ 2008-062288

(51) Int. Cl.
*H01L 31/00*   (2006.01)
*H01L 21/00*   (2006.01)

(52) U.S. Cl. .......................................... 257/459; 438/48

(58) Field of Classification Search .............. 257/79–98, 257/431, 459; 385/14, 16; 438/25, 48
See application file for complete search history.

(56) References Cited

U.S. PATENT DOCUMENTS 7,508,046 B2 *   3/2009   Nagai et al. .................... 257/459
7,724,989 B2 *   5/2010   Kodama et al. ................. 385/14
7,729,570 B2 *   6/2010   Yamada et al. ................. 385/14

FOREIGN PATENT DOCUMENTS

JP   9-40756   2/1997
JP   2002-76206   3/2002

* cited by examiner

*Primary Examiner* — Calvin Lee
(74) *Attorney, Agent, or Firm* — Young & Thompson

(57) ABSTRACT

In recent years, as electronic equipment becomes thinner, an area for mounting a semiconductor device used in the electronic equipment is required to be smaller, and a thickness of an encapsulating resin for encapsulating a semiconductor substrate having a circuit formed thereon and the like also becomes smaller. The encapsulating resin is marked with a product number, a manufacturer name, or the like. There arises a problem in that, in the marking, an infrared laser beam applied to the encapsulating resin passes through the encapsulating resin, generates heat in the semiconductor substrate, and destructs the formed circuit. By providing a thin film for refracting the infrared laser beam on a rear surface of the semiconductor substrate, the optical path of the infrared laser beam is made longer to reduce heat generated in the semiconductor substrate.

9 Claims, 12 Drawing Sheets

SEMICONDUCTOR DEVICE

BACKGROUND OF THE INVENTION

1. Field of the Invention

The present invention relates to a semiconductor device, and more particularly, to a semiconductor device which has a semiconductor substrate on a package substrate.

2. Description of the Related Art

In recent years, electronic equipment using a semiconductor device, for example, a cellular phone, is required to be thinner. In order to fulfill the demand for thinner electronic equipment, it is important to reduce an area for mounting a semiconductor device used in the electronic equipment. Therefore, in a semiconductor device of recent years, during the process of manufacturing the semiconductor device, a semiconductor substrate is ground to be thinner or an encapsulating resin for encapsulating the semiconductor substrate and the like is made thinner to reduce the area for mounting, for example.

Japanese Patent Application Laid-Open No. 2002-076206 discloses an exemplary configuration of a semiconductor device, which is illustrated in FIG. 13. In FIG. 13, a semiconductor device 1300 includes balls 1301, a substrate 1302 disposed on the balls 1301, projections 1303 disposed on the substrate 1302, a resin 1304 for covering the projections 1303, a chip 1305 disposed on the projections 1303, and an epoxy resin 1306 for encapsulating the chip 1305, the projections 1303, and the resin 1304. Japanese Patent Application Laid-Open No. 2002-076206 discloses a technology which may enhance the effect of exhausting heat generated by the chip 1305 by directly bringing the epoxy resin 1306 into contact with the chip 1305.

Japanese Patent Application Laid-Open No. Hei 9-040756 discloses a technology which adjusts the ingredients of an epoxy resin which is a resin for encapsulating a semiconductor device.

During the process of manufacturing a semiconductor device, it is necessary to mark an encapsulating resin for encapsulating a semiconductor substrate having a circuit for implementing a desired function formed thereon with the product number of the manufactured semiconductor device, the manufacturer name of the semiconductor device, or the like. The marking is carried out by irradiating the encapsulating resin with an infrared laser to engrave the product number, the manufacturer name, or the like. However, as described above, the encapsulating resin is getting thinner and thinner in semiconductor devices of recent years, and hence the applied infrared laser may passes through the encapsulating resin to reach the semiconductor substrate having the circuit formed thereon. Thus, there arises a problem in that the semiconductor device malfunctions under the influence of the infrared laser applied to the semiconductor substrate. The inventor of the present invention has confirmed by experiments that a semiconductor device, which operated normally before marking, malfunctioned after the marking. The inventor of the present invention thinks that, because of the infrared laser applied to the semiconductor substrate, heat is generated in the semiconductor substrate, the generated heat disconnects wiring of the circuit formed on the semiconductor substrate, and thus, the semiconductor device malfunctions.

SUMMARY

The present invention has been made in view of the above-mentioned problem, and therefore has an object to provide a semiconductor device which may prevent malfunction thereof under the influence of an infrared laser applied to an encapsulating resin when marking is made.

A semiconductor device according to the present invention includes: a package substrate; a connecting portion provided on the package substrate; a semiconductor substrate having a main surface and a surface opposite to the main surface, the main surface having connecting terminals formed so as to correspond to the connecting portion and electrically connected to the connecting portion, and the surface opposite to the main surface having a thin film formed thereon; and an encapsulating resin for encapsulating the connecting portion, the semiconductor substrate, and the thin film, in which the thin film has an index of refraction which is smaller than an index of refraction of the encapsulating resin. When the marking is made, an infrared laser which passes through the encapsulating resin is refracted on an interface of the thin film to make longer the optical path of the infrared laser, thereby making heat generated by the infrared laser less likely to be conducted to the semiconductor substrate.

A semiconductor device according to the present invention may prevent malfunction thereof under the influence of an infrared laser applied to an encapsulating resin when the marking is made.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
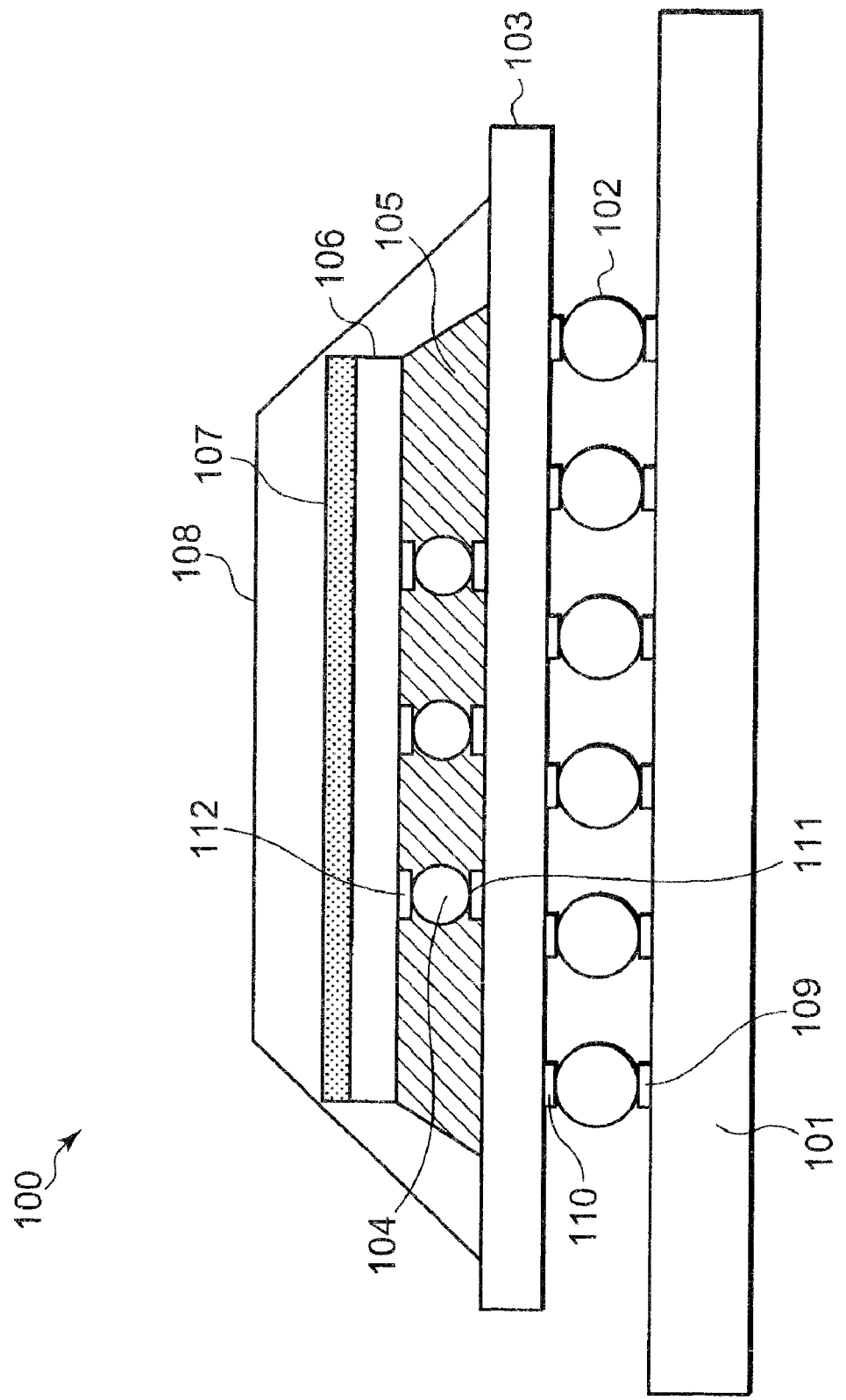
FIG. 1 illustrates a semiconductor device according to an embodiment of the present invention.
Figure 2:
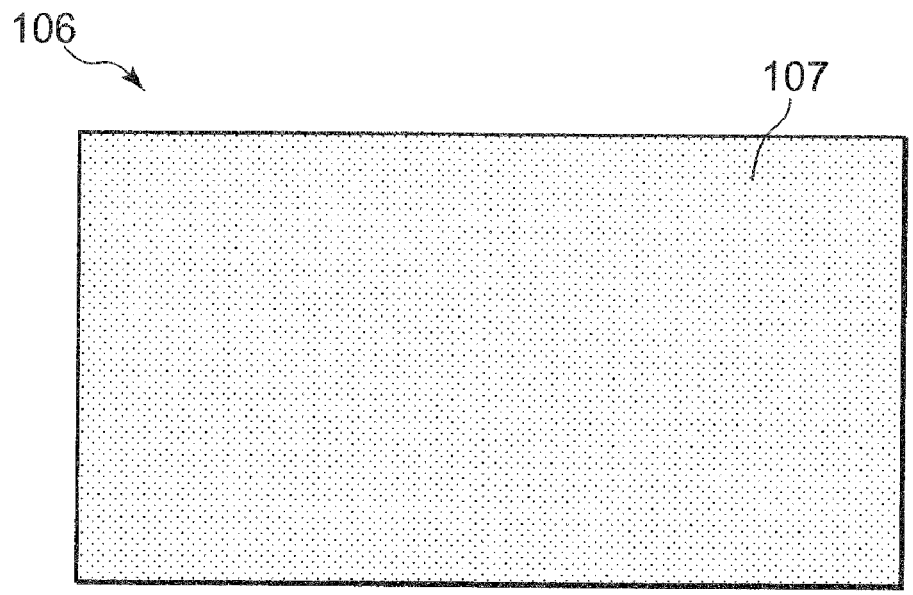
FIG. 2 is a top view of a semiconductor substrate of the semiconductor device according to the embodiment.

The best mode for carrying out the present invention is described in the following with reference to the attached drawings. FIG. 1 illustrates a semiconductor device 100 according to an embodiment of the present invention. The semiconductor device 100 is mounted on a mounting substrate 101. A plurality of solder balls 102 provided on the mounting substrate 101 so as to be spaced apart from one another electrically connect the mounting substrate 101 and a package substrate 103 via connecting terminals 109 provided on an upper surface of the mounting substrate 101 and connecting terminals 110 provided on a lower surface of the package substrate 103. The package substrate 103 is a substrate for disposing a semiconductor substrate 106 having a circuit which performs desired operation formed thereon. The package substrate 103 is electrically connected to the semiconductor substrate 106 via connecting terminals 111 provided on an upper surface of the package substrate 103, a plurality of solder balls 104 provided so as to be spaced apart from one another, and connecting terminals 112 provided on a main surface of the semiconductor substrate 106. As described above, the package substrate 103 is also electrically connected to the mounting substrate 101 via the connecting terminals 110 and 109 and the solder balls 102. A resin 105 fixes the solder balls 104. The semiconductor substrate 106 has wiring on a lower surface thereof in FIG. 1, that is, a surface thereof on the side of the solder balls 104 (i.e., front surface), and has the circuit which performs desired operation formed thereon. In other words, in this embodiment, a flip-chip (FC) BGA structure is adopted. A surface which is opposite to the main surface (that is, rear surface) has a thin film 107 of, for example, $SiO_2$ formed thereon. The semiconductor substrate 106 is formed of, for example, silicon (Si). It is to be noted that the thickness of the semiconductor substrate 106 is, for example, 150 μm. The thin film 107 is provided for the purpose of refracting a laser beam in marking. An epoxy resin 108 which is an encapsulating resin for encapsulating the solder balls 104, the resin 105, the semiconductor substrate 106, the thin film 107, and the like is provided on the package substrate 103. The epoxy resin 108 is irradiated with an infrared laser to mark the epoxy resin 108 with the product number, the manufacturer name, or the like of the semiconductor device 100. FIG. 2 is a top view of the semiconductor substrate 106. As illustrated in FIG. 2, the thin film 107 is provided over the entire rear surface of the semiconductor substrate 106.

Figure 3:
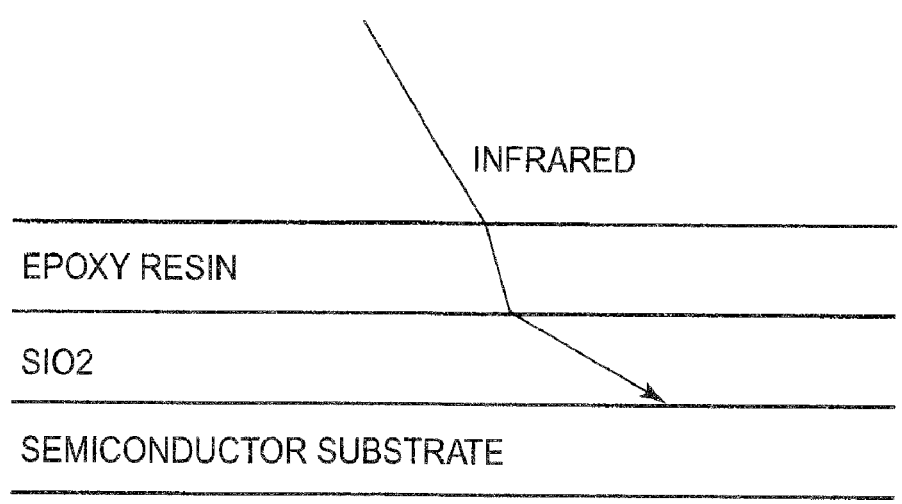
FIG. 3 illustrates refraction of an infrared laser beam.

Here, the relationship between the thin film 107 and the infrared laser in marking is described with reference to FIG. 3. FIG. 3 is a schematic sectional view of the semiconductor substrate 106, the thin film 107 which is $SiO_2$, and the epoxy resin 108 of the semiconductor device 100. As illustrated in FIG. 3, the epoxy resin 108 is irradiated with the infrared laser to mark the epoxy resin 108 with the product number, the manufacturer name, or the like. Here, the infrared laser is a light beam, and thus, the infrared laser is refracted when entering into a medium having a different index of refraction. The index of refraction of the epoxy resin 108 is, for example, on the order of 1.55 to 1.61. Therefore, the wavelength of the laser beam which enters into the epoxy resin 108 becomes shorter, and is refracted at an angle as illustrated in FIG. 3. The laser beam which enters into $SiO_2$ through the epoxy resin 108 is again refracted. The index of refraction of $SiO_2$ is on the order of 1.46, which is smaller than that of the epoxy resin 108. Therefore, the wavelength of the laser beam is longer in $SiO_2$ than in the epoxy resin 108, and the laser beam is refracted as illustrated in FIG. 3.

In the semiconductor device 100 according to this embodiment, the thin film 107 which is $SiO_2$ is provided on the rear surface of the semiconductor substrate 106, and hence the infrared laser beam which passes through the epoxy resin 108 is refracted on an interface of $SiO_2$, and the optical path of the infrared laser beam to the semiconductor substrate 106 becomes longer than that when $SiO_2$ is not provided. The longer optical path to the semiconductor substrate 106 reduces heat conducted to the semiconductor substrate 106. Heat conduction is, in the case of a solid, based on energy propagation by lattice vibration of atoms forming the solid (phonons). The laser beam vibrates the atoms of the epoxy resin 108, heat as energy is generated, and the vibration of the atoms is transferred to the side of the semiconductor substrate 106 via atoms. In other words, heat is propagated. Here, by providing $SiO_2$, the laser beam is refracted to make longer the optical path of the laser beam, thereby making longer the propagation path of the energy. As the propagation path of the energy to the semiconductor substrate 106 is longer, the vibration, that is, the energy which reaches the semiconductor substrate 106 is more damped, and thus, heat generated in the semiconductor substrate 106 may be reduced.

It is to be noted that, in the above-mentioned embodiment, $SiO_2$ is used as the thin film, but other materials may be used as the thin film insofar as it may make longer the optical path to the semiconductor substrate 106. In other words, a material having the index of refraction which is smaller than that of the epoxy resin 108 may be used. This is because, if the index of refraction is smaller than that of the epoxy resin 108, the infrared laser is refracted in the direction in which the optical path thereof becomes longer. Further, instead of employing the thin film 107 formed of a single material, a thin film formed by laminating a plurality of materials having different indices of refraction may also be used. In that case, a configuration may be adopted in which a first thin film located immediately below the epoxy resin 108 has an index of refraction which is smaller than that of the epoxy resin 108, and a second thin film located below the first thin film has an index of refraction which is smaller than that of the first thin film. If such a configuration is adopted, the optical path of the infrared laser beam which passes through the epoxy resin 108 becomes still longer. As a matter of course, a third thin film having the index of refraction which is smaller than that of the second thin film may be further provided below the second thin film to make still longer the optical path of the laser beam.

Further, the thickness of the thin film 107 for refracting the laser beam is preferably on the order of 10 μm. If the thin film 107 is excessively thick, it is against the demand of recent years for a reduced area for mounting the semiconductor device. If the thin film 107 is excessively thin, the rear surface of the semiconductor substrate 106 may not be coated uniformly with the thin film 107, and thus, the rear surface of the semiconductor substrate 106 has a portion on which the thin film 107 is not provided, which causes the laser beam not to be refracted.

Figure 4:
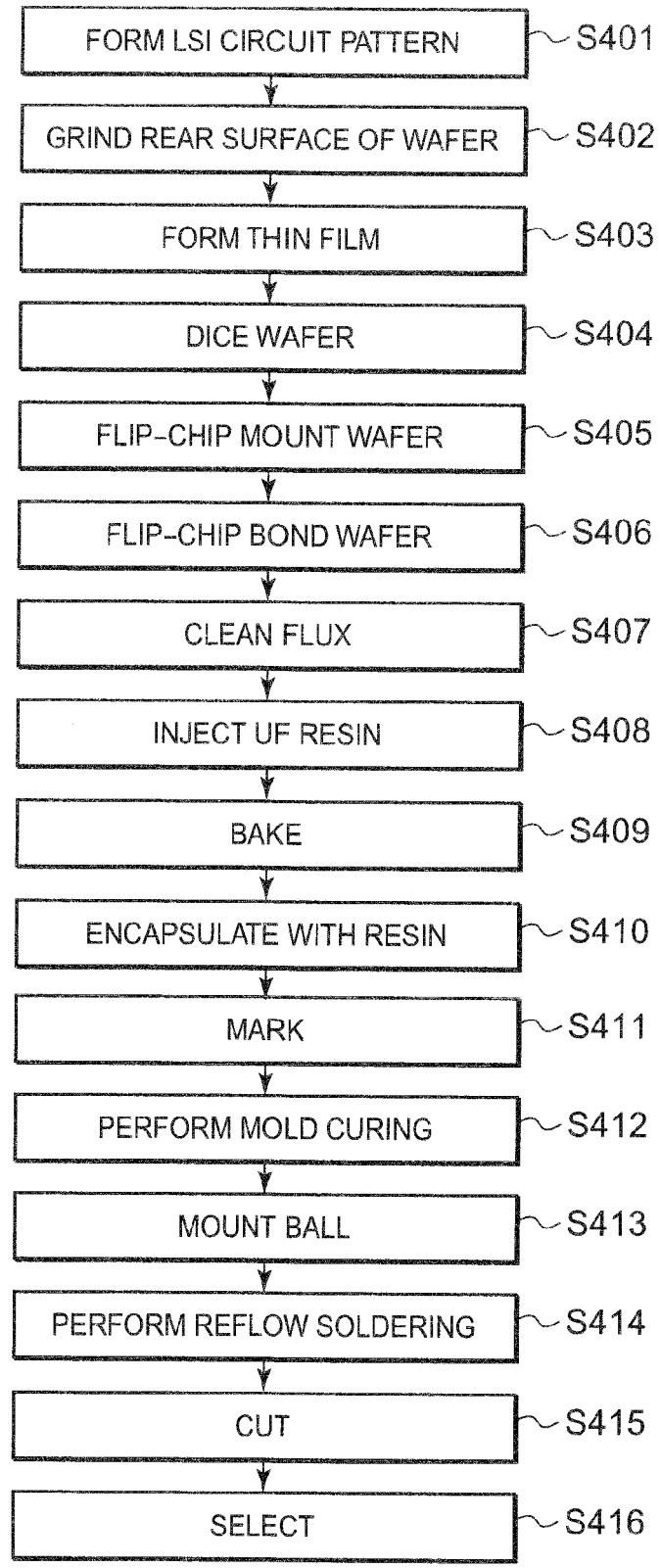
FIG. 4 is a flow chart illustrating a method of manufacturing the semiconductor device according to the embodiment.

Next, a method of manufacturing the semiconductor device 100 according to this embodiment is described with reference to FIGS. 4 to 12. FIG. 4 is a flow chart illustrating the method of manufacturing the semiconductor device 100 according to the embodiment. A circuit pattern for performing desired operation is formed on a surface of a semiconductor wafer 500 before the semiconductor substrate 106 is cut out from the semiconductor wafer 500 (S401). Here, the connecting terminals 112 and the plurality of solder balls 104 provided so as to be spaced apart from one another are also formed. Then, the semiconductor wafer 500 is ground (S402). The grinding is carried out for the purpose of decreasing the area for mounting the entire semiconductor device, and, for example, the semiconductor wafer 500 having a thickness of 500 μm is ground to a thickness of 150 μm.

After the rear surface of the semiconductor wafer 500 is ground, the thin film 107 for refracting the infrared laser is formed on the rear surface of the semiconductor wafer 500 (S403).

Figure 5:
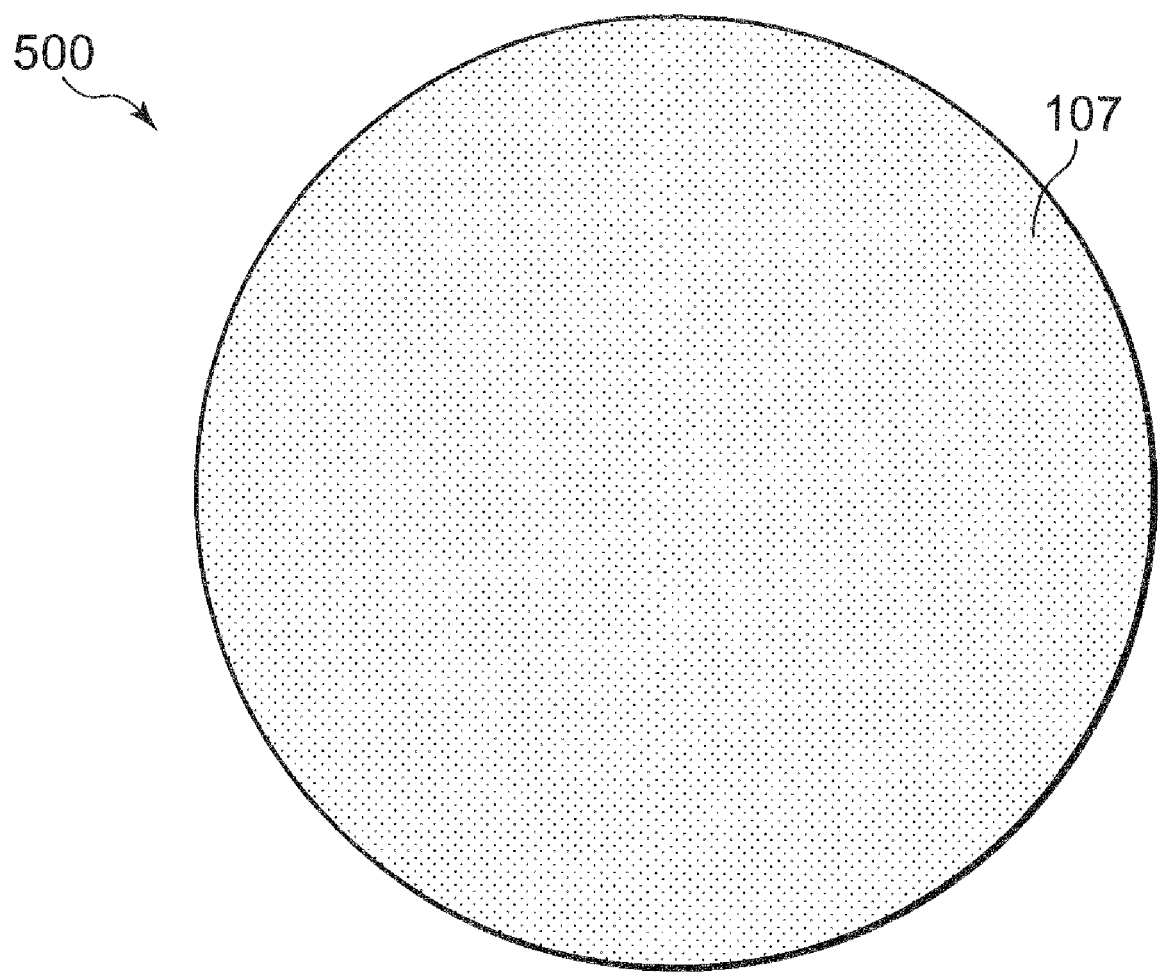
FIG. 5 illustrates a thin film formed on a rear surface of a semiconductor wafer.

FIG. 5 illustrates the semiconductor wafer 500. The thin film 107 which is, for example, SiO$_2$, is provided on the entire rear surface of the semiconductor wafer 500. The thin film 107 is formed on the entire rear surface of the semiconductor wafer 500 by, for example, sputtering.

Then, the semiconductor wafer 500 is diced to cut out the semiconductor substrate 106 (S404).

Figure 6:
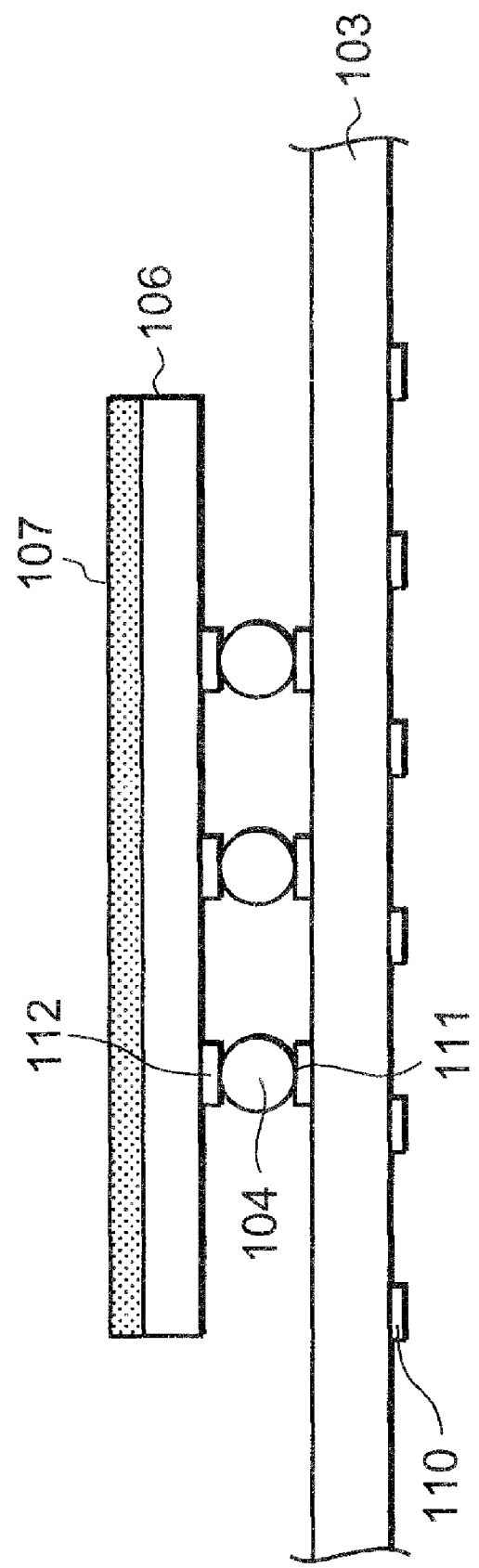
FIG. 6 illustrates a manufacturing process step of the semiconductor device according to the embodiment.
Figure 7:
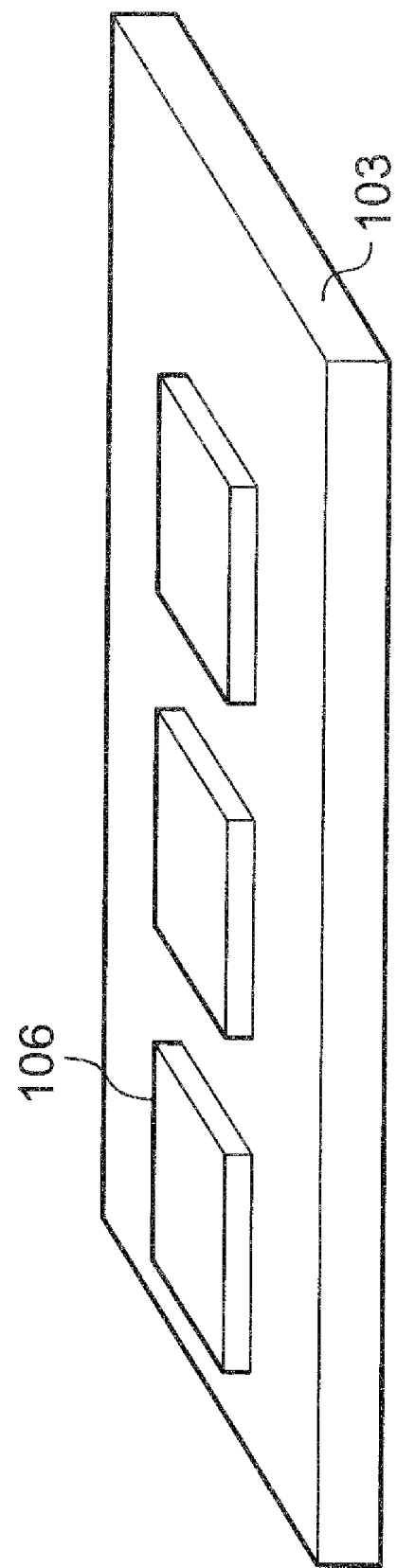
FIG. 7 illustrates the manufacturing process step of the semiconductor device according to the embodiment.

The semiconductor substrate 106 which is cut out is mounted on the package substrate 103 (S405), which is illustrated in FIG. 6. The plurality of solder balls 104 located on the surface having the circuit formed thereon are mounted on the package substrate 103. In this step, as illustrated in FIG. 7, there exist a plurality of semiconductor substrates 106 on the entire package substrate 103.

Then, heat treatment is carried out with regard to the semiconductor substrate 106 mounted on the package substrate 103 to make the adhesion satisfactory between the solder balls 104 and the connecting terminals 111 (S406).

Figure 8:
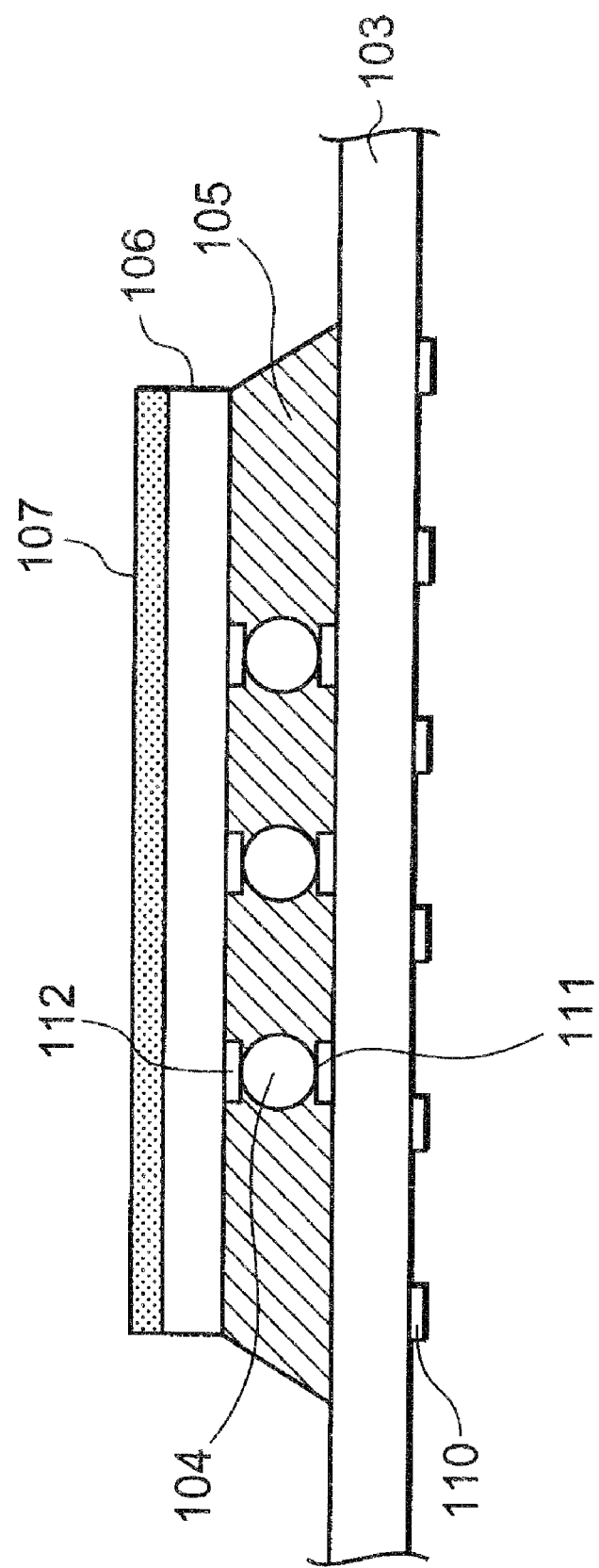
FIG. 8 illustrates the manufacturing process step of the semiconductor device according to the embodiment.

After cleaning for removing impurities generated by the heat treatment is carried out (S407), the resin 105 for filling space between the solder balls 104 is injected (S408). The state of the semiconductor device of this step is illustrated in FIG. 8.

After that, baking is carried out to cure the resin 105 and fix the solder balls 104 (S409).

Figure 9:
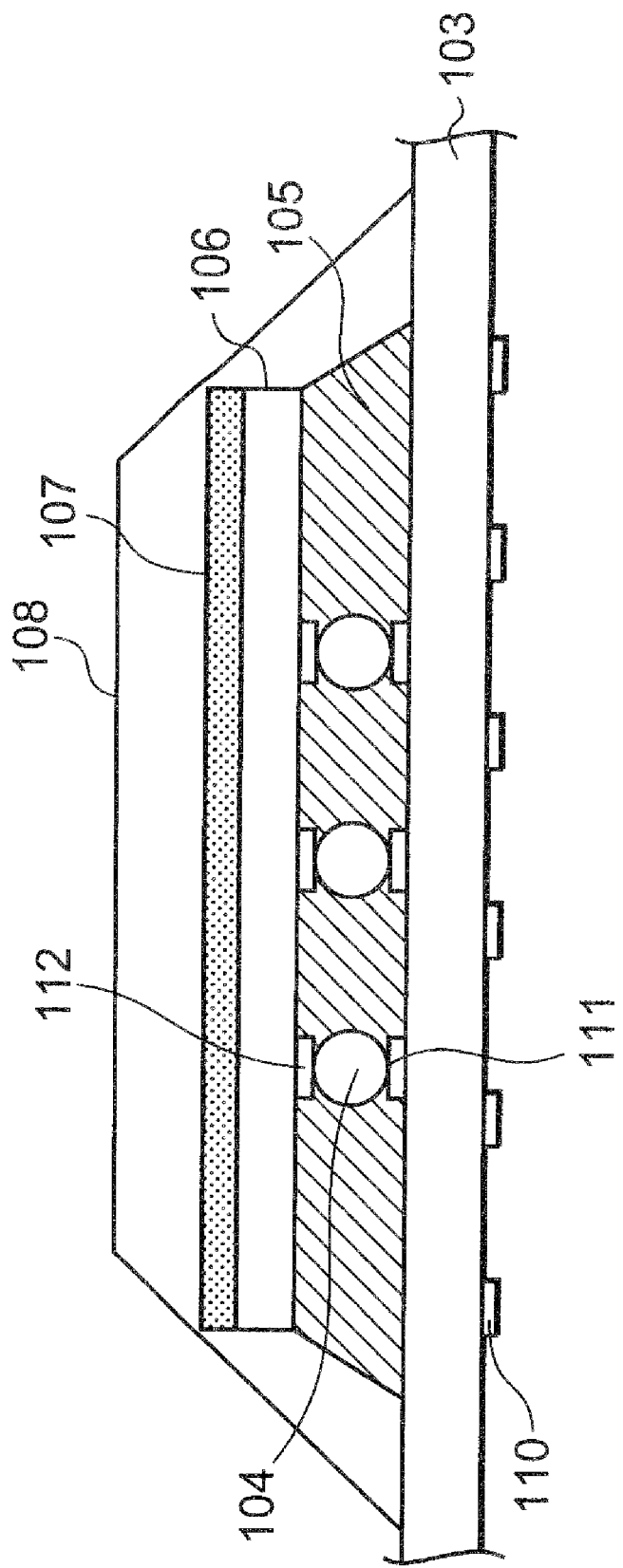
FIG. 9 illustrates the manufacturing process step of the semiconductor device according to the embodiment.
Figure 10:
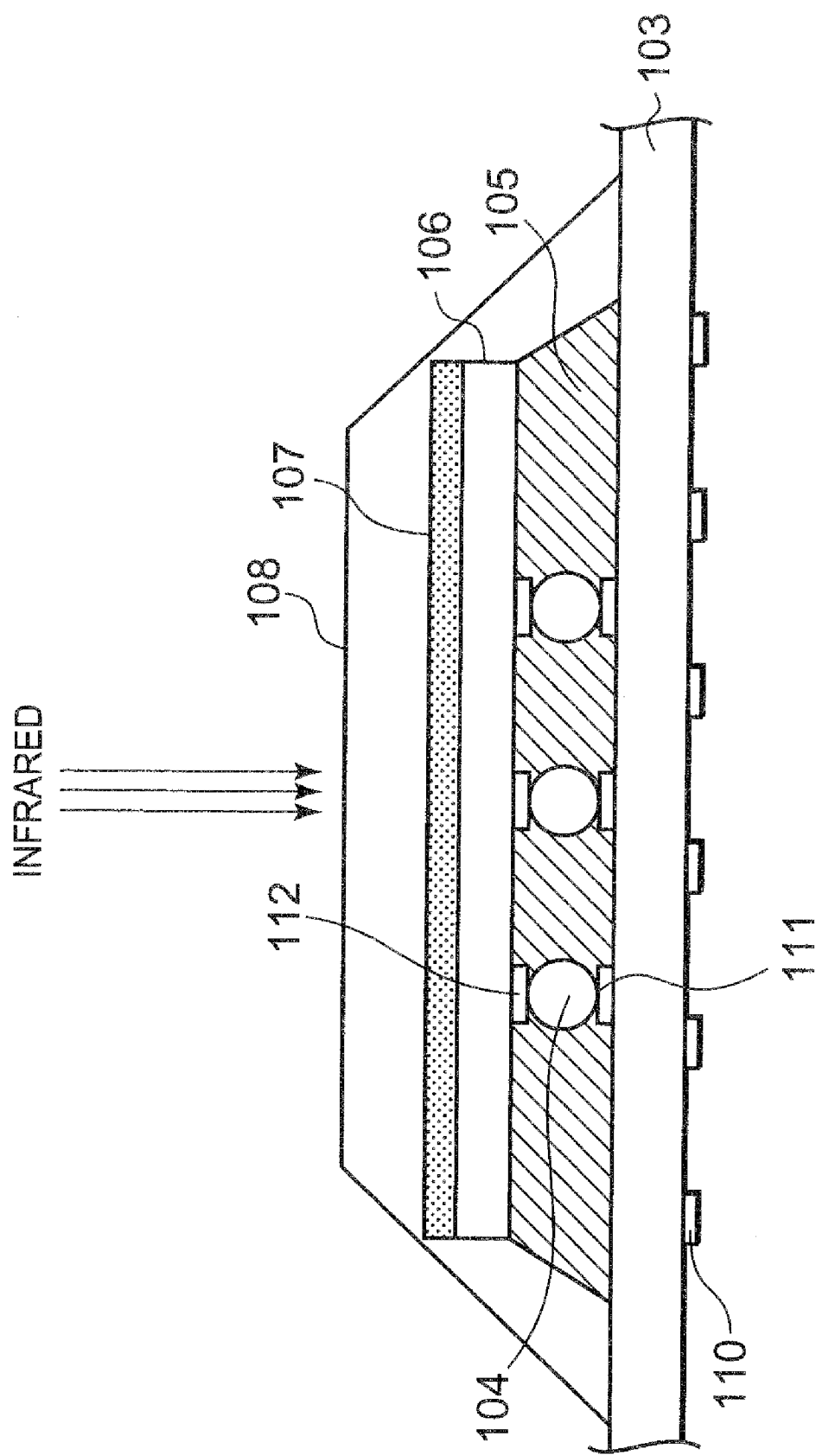
FIG. 10 illustrates the manufacturing process step of the semiconductor device according to the embodiment.

Further, the semiconductor substrate 106 and the like are encapsulated by the epoxy resin 108 (S410). After that, marking is carried out (S411). The state of the semiconductor device of this step is illustrated in FIGS. 9 and 10. The epoxy resin 108 is irradiated with an infrared laser to carry out marking. Here, the infrared laser is refracted by the thin film 107 to make longer the optical path of the infrared laser. The longer optical path of the infrared laser prevents thermal destruction of the circuit formed on the semiconductor substrate 106.

Figure 11:
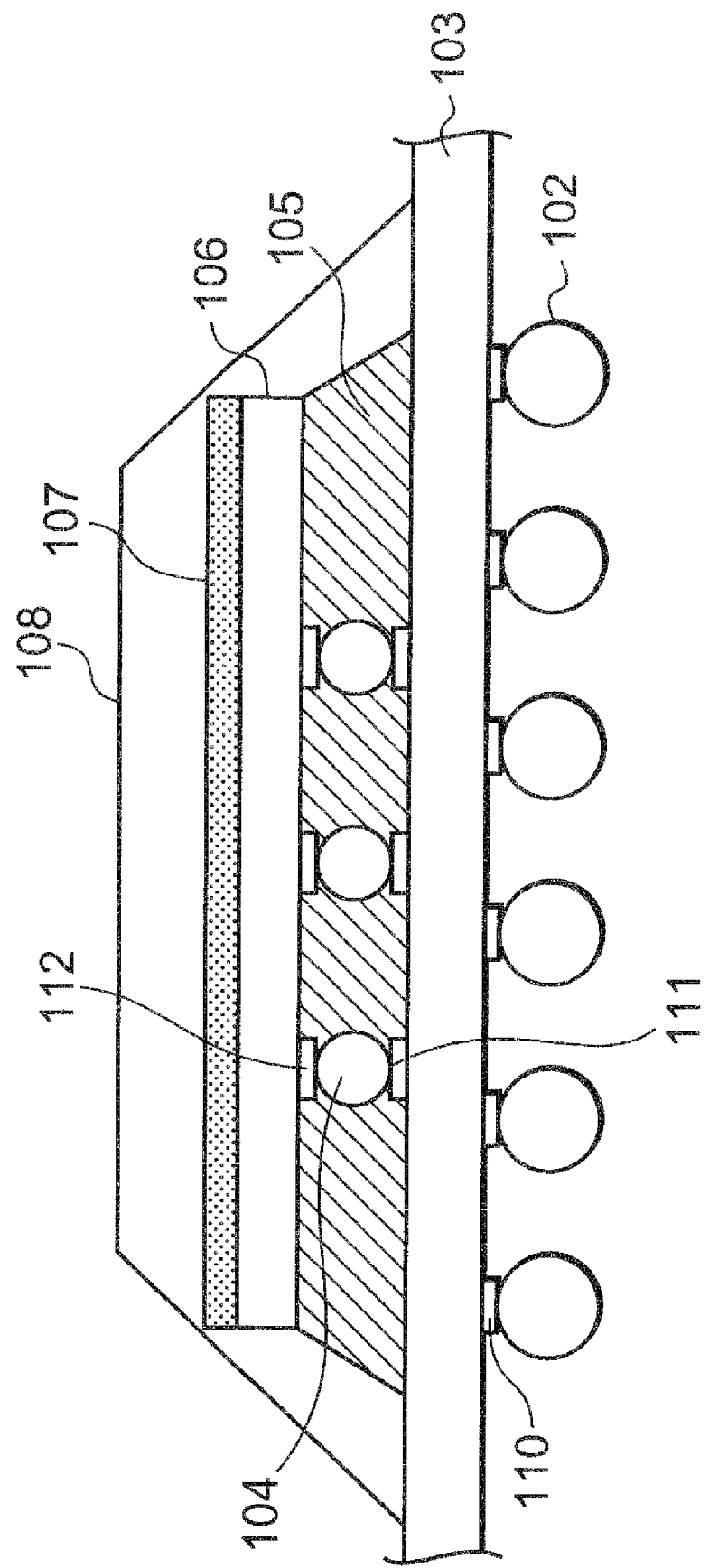
FIG. 11 illustrates the manufacturing process step of the semiconductor device according to the embodiment.

Then, after impurities generated in the epoxy resin 108 are removed (S412), the package substrate 103 is placed on the solder balls 102 provided so as to be spaced apart from one another (S413). The state of the semiconductor device of this step is illustrated in FIG. 11. Then, heat treatment is carried out to enhance the adhesion between the solder balls 102 and the connecting terminals 110 (S414).

Figure 12:
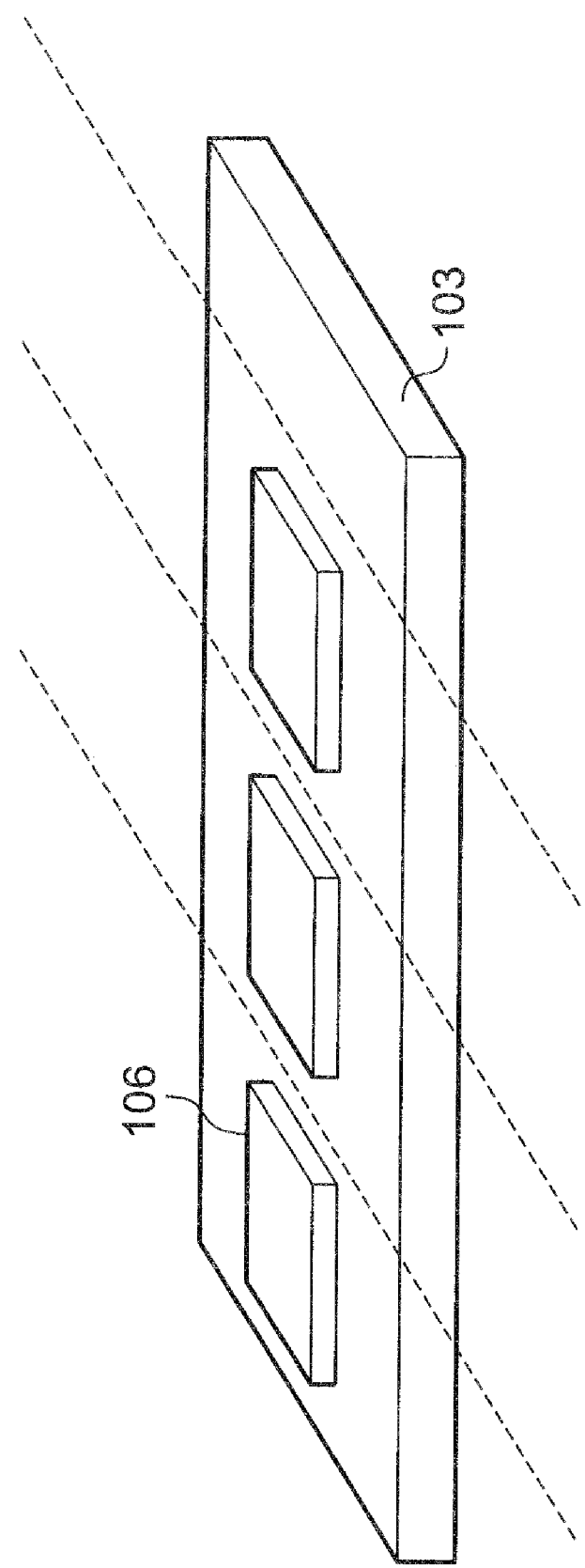
FIG. 12 illustrates the manufacturing process step of the semiconductor device according to the embodiment.
Figure 13:
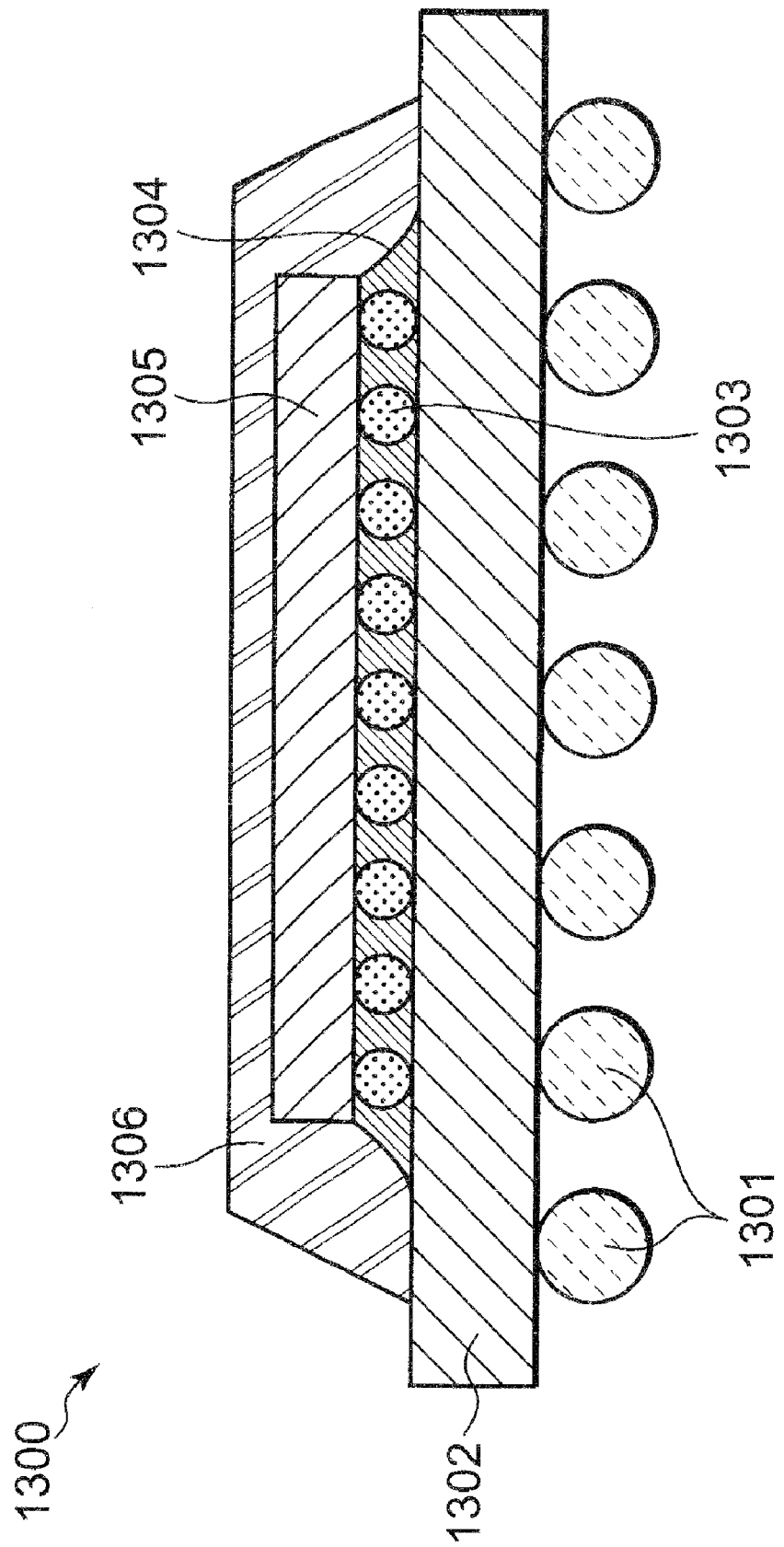
FIG. 13 illustrates a conventional semiconductor device.

Further, in order to cut out individual semiconductor devices formed in the processes up to this step, the package substrate 103 is cut (S415), which is illustrated in FIG. 12. Finally, operation of the individual semiconductor devices which are cut out is checked and a selection is made (S416).

When a customer mounts the semiconductor device which is cut out on the mounting substrate 101, manufacture of the semiconductor device 100 according to this embodiment is completed. It is to be noted that the above describes a mere embodiment of the present invention and the scope of the present invention should not be construed to be limited thereto.

It is apparent that the present invention is not limited to the above embodiments, but may be modified and changed without departing from the scope and spirit of the invention.

What is claimed is:

1. A semiconductor device, comprising:
   a package substrate;
   a connecting portion provided on the package substrate;
   a semiconductor substrate having a main surface and a surface opposite to the main surface, the main surface having connecting terminals formed so as to correspond to the connecting portion and connected to the connecting portion, and the surface opposite to the main surface having a thin film formed thereon; and
   an encapsulating resin for encapsulating the connecting portion, the semiconductor substrate, and the thin film,
   wherein the thin film has an index of refraction which is smaller than an index of refraction of the encapsulating resin, and wherein the thin film comprises a first thin film and a second thin film, the second thin film being located below the first thin film and having an index of refraction different from an index of refraction of the first thin film.

2. A semiconductor device according to claim 1, wherein the index of refraction of the second thin film is smaller than the index of refraction of the first thin film.

3. A semiconductor device according to claim 1, wherein:
   the connecting portion is a first connecting portion; and
   the semiconductor device further comprises a second connecting portion which is provided on a surface of the package substrate opposite to a surface of the package substrate having the first connecting portion provided thereon and is used for electrical connection between the package substrate and another device.

4. A semiconductor device according to claim 3, wherein the first connecting portion is a plurality of solder balls provided so as to be spaced apart from one another.

5. A semiconductor device according to claim 4, further comprising a resin which is provided between the package substrate and the semiconductor substrate and covers the plurality of solder balls.

6. A semiconductor device according to claim 3, wherein the second connecting portion is a plurality of solder balls provided so as to be spaced apart from one another.

7. A semiconductor device according to claim 3, further comprising a mounting substrate connected to the second connecting portion.

8. A semiconductor device according to claim 1, wherein:
   the encapsulating resin comprises an epoxy resin; and
   the thin film comprises SiO$_2$.

9. A semiconductor device, comprising:
   a package substrate;
   a connecting portion provided on the package substrate;
   a semiconductor substrate having a main surface and a surface opposite to the main surface, the main surface having connecting terminals formed so as to correspond to the connecting portion and connected to the connecting portion, and the surface opposite to the main surface having a thin film formed thereon; and
   an encapsulating resin for encapsulating the connecting portion, the semiconductor substrate, and the thin film,
   wherein the thin film makes an optical path of light longer, the light passing through the encapsulating resin, and wherein the thin film comprises a first thin film and a second thin film, the second thin film being located below the first thin film and having an index of refraction different from an index of refraction of the first thin film.

* * * * *